(12) United States Patent
More

(10) Patent No.: US 12,550,360 B2
(45) Date of Patent: Feb. 10, 2026

(54) SOURCE/DRAIN CONTACT LANDING

(71) Applicant: Taiwan Semiconductor Manufacturing Company, Ltd., Hsinchu (TW)

(72) Inventor: Shahaji B. More, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 918 days.

(21) Appl. No.: 17/830,938

(22) Filed: Jun. 2, 2022

(65) Prior Publication Data

US 2023/0395721 A1    Dec. 7, 2023

(51) Int. Cl.
*H10D 30/62* (2025.01)
*H10D 62/10* (2025.01)
*H10D 64/01* (2025.01)
*H10D 84/83* (2025.01)

(52) U.S. Cl.
CPC ..... *H10D 30/6211* (2025.01); *H10D 30/6219* (2025.01); *H10D 62/115* (2025.01); *H10D 64/021* (2025.01); *H10D 84/834* (2025.01)

(58) Field of Classification Search
CPC .... H01L 21/823871; H01L 21/823814; H10D 30/6219; H10D 64/256; H10D 84/853
See application file for complete search history.

(56) References Cited

U.S. PATENT DOCUMENTS

| | | | |
|---|---|---|---|
| 10,950,730 B2 | 3/2021 | Lin et al. | |
| 2017/0148797 A1* | 5/2017 | Kim | H10D 30/024 |
| 2020/0127113 A1* | 4/2020 | Ching | H10D 84/0151 |
| 2021/0193534 A1 | 6/2021 | Chen | |
| 2022/0029001 A1 | 1/2022 | Chang | |
| 2022/0052044 A1 | 2/2022 | More | |

\* cited by examiner

*Primary Examiner* — Alia Sabur
(74) *Attorney, Agent, or Firm* — HAYNES AND BOONE, LLP

(57) ABSTRACT

A semiconductor structure according to the present disclosure includes a first p-type epitaxial feature disposed over a first fin, a second p-type epitaxial feature disposed and spanning over a second fin and a third fin, an interlayer dielectric (ILD) layer over the first p-type epitaxial feature and the second p-type epitaxial feature, a first contact extending through the ILD layer to electrically couple to the first p-type epitaxial feature, and a second contact extending through the ILD layer to electrically coupled to the second p-type epitaxial feature. A bottom surface of the first contact is lower than a bottom surface of the second contact.

20 Claims, 11 Drawing Sheets

SOURCE/DRAIN CONTACT LANDING

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

The scaling down has introduced challenges in reduction of parasitic resistance. For example, an epitaxial source/drain feature may include multiple epitaxial layers. Some of the multiple epitaxial layers are formed to reduce lattice mismatch and some of the multiple epitaxial layers are heavily doped. Lattice mismatch reduction and heavy doping are all conducive to reduction of contact resistance. Depending on the conductivity types, these multiple epitaxial layers may have different shapes and concentration profiles. While existing source/drain contacts are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
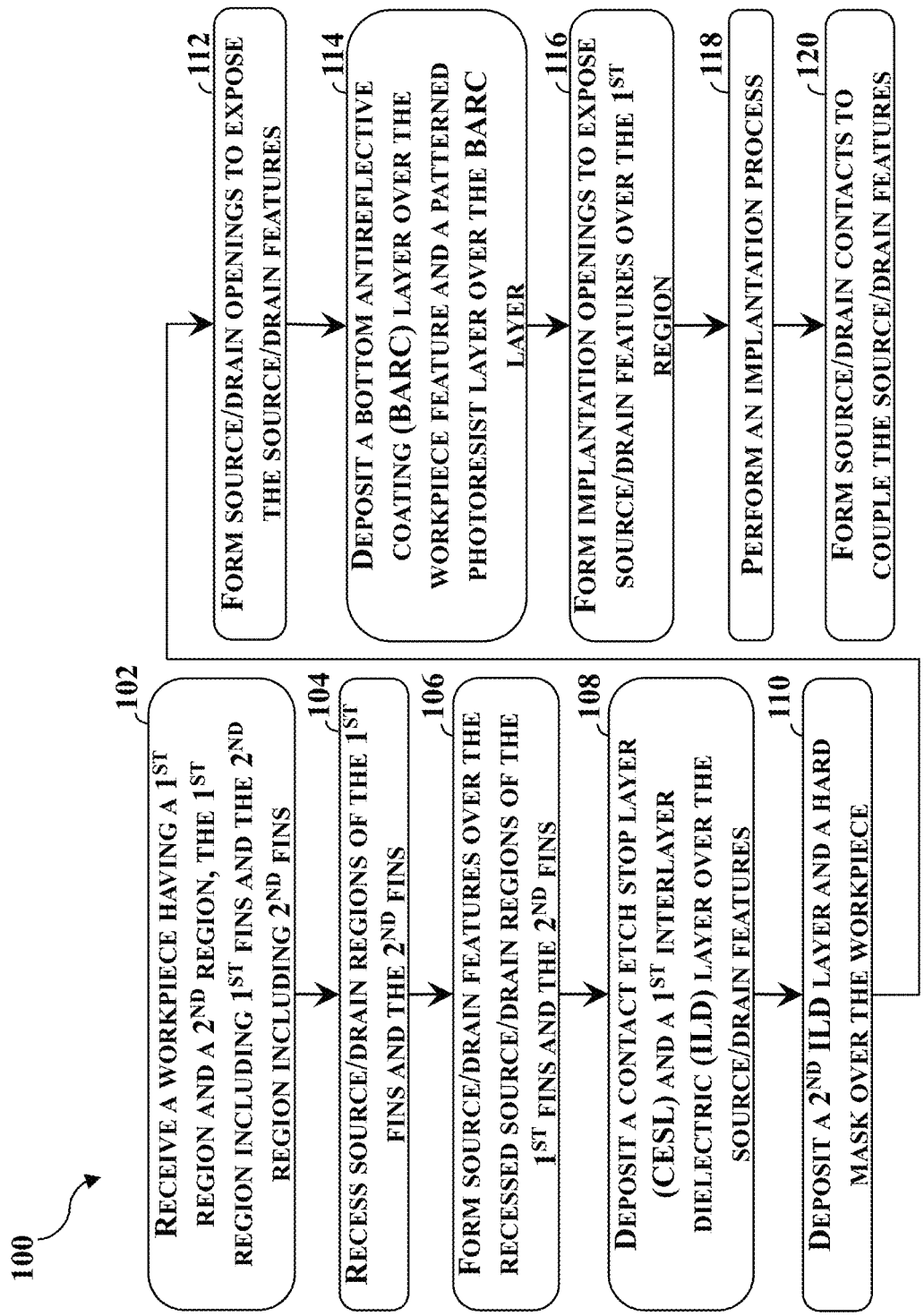
FIG. 1 is a flowchart of a method of fabricating a semiconductor structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

To form source/drain features for a multi-gate device, source/drain regions of a fin (for a FinFET) or a fin-shaped structure (for an MBC transistor) are recessed. As used herein, a source/drain region, or "s/d region," may refer to a source or a drain of a device. It may also refer to a region that provides a source and/or drain for multiple devices. After the recessing, multiple epitaxial layers are sequentially formed over the source/drain regions. In one example, the multiple epitaxial layers may include a first epitaxial layer, a second epitaxial layer, and a third epitaxial layer. The first epitaxial layer interfaces with the recessed fin (or fin-shaped structure) and channel region and is featured with a low or modest dopant concentration/germanium content. The low dopant concentration/germanium content helps reduce lattice mismatch and defects, which may increase resistance. The second epitaxial layer includes a high dopant concentration or a high germanium content to reduce contact resistance or strain the channel region to increase carrier mobility. The third epitaxial layer is formed of a more etch resistant material to serve as a protective layer of the second epitaxial layer. Presence of dopants and different active region configuration make it more complicated to form source/drain contacts. Source/drain contacts with a uniform height may not reliably form low-resistant connection with different source/drain regions.

The present disclosure provides p-type and n-type source/drain features with different raise heights such that the source/drain contact may be formed with minimal loss of the p-type and n-type source/drain features and low contact resistance.

The various aspects of the present disclosure will now be described in more detail with reference to the figures. FIG. 1 illustrates a flowchart of a method 100 for forming a semiconductor structure on a workpiece 200 (illustrated in FIGS. 2-11) in accordance with various aspects of the present disclosure. The method 100 is merely an example and is not intended to limit the present disclosure beyond what is explicitly recited in the claims. Additional operations may be performed before, during, and after the method 100, and some operations described can be replaced, eliminated, or moved around for additional embodiments of the method 100. The method 100 is described below in conjunction with FIGS. 2~11, which illustrate various diagrammatic cross-sectional views of the semiconductor structure on the workpiece during intermediate steps of the method 100. Because a semiconductor device or a semiconductor structure will be formed from the workpiece 200, the workpiece 200 may be referred to as a semiconductor device 200 or a semiconductor structure 200 as the context requires. Throughout FIGS. 2-11, the X direction, the Y direction, and the Z direction are perpendicular to one another and are used consistently. Additionally, throughout the present disclosure, like reference numerals are used to denote like features unless otherwise described.

FIGS. 2-11 illustrate structures or intermediate structures of FinFETs. As described above, a FinFET has a gate structure that wrap over a channel region of a semiconductor fin formed from a semiconductor substrate or an epitaxial layer deposited on the semiconductor substrate. The channel region of the semiconductor fin is sandwiched between two source/drain features formed using epitaxial growth. Because fabrication of an MBC transistor includes formation of a fin-shaped structure, a person of ordinary skill in the art would understand that the processes and structures described in the present disclosure may be applicable in whole or in part to an MBC transistor. For this reasons and for brevity, operations in method 100 will not be separately described in length.

Figure 2:
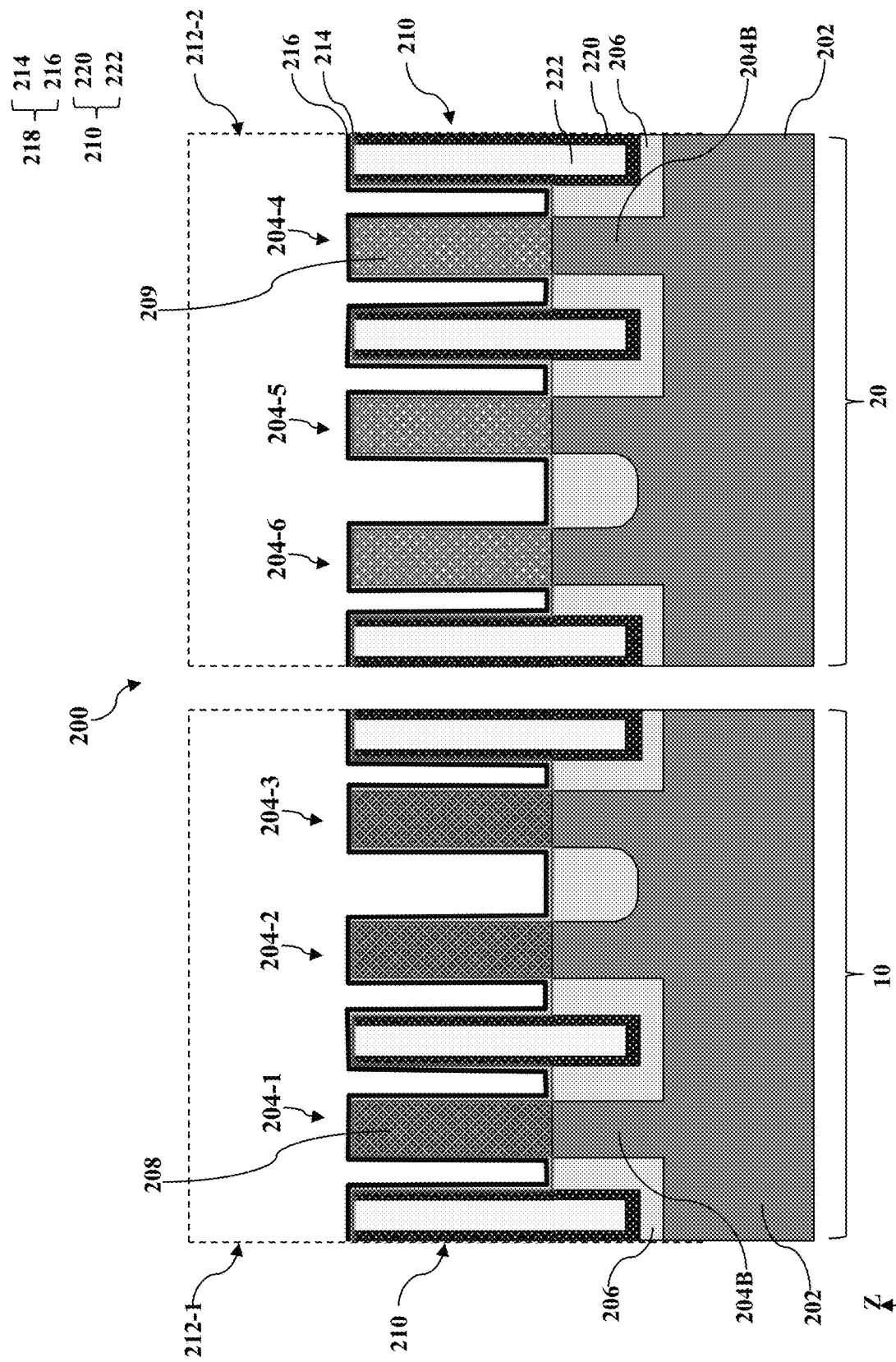
FIGS. 2~11 are diagrammatic cross-sectional views of a first region and a second region of a workpiece at various stages of fabrication according to various embodiments of the present disclosure.

Referring to FIGS. 1 and 2, method 100 includes a block 102 where a workpiece 200 that includes a first region 10 and a second region 20. As shown in FIG. 2, the workpiece 200 includes a substrate 202. Over the first region 10, a first fin 204-1, a second fin 204-2 and a third fin 204-3 extend vertically from the substrate 202. Over the second region 20, a fourth fin 204-4, a fifth fin 204-5 and a sixth fin 204-6 extend vertically from the substrate 202. Each of the first fin 204-1, the second fin 204-2, the third fin 204-3, the fourth fin 204-4, the fifth fin 204-5, and the sixth fin 204-6 extend lengthwise along the Y direction and are spaced apart from one another along the X direction by portions of an isolation feature 206. The workpiece 200 also includes hybrid fins 210 that extend into the isolation feature 206.

The substrate 202 may be an elementary (single element) semiconductor, such as silicon (Si) or germanium (Ge) in a crystalline structure; a compound semiconductor, such as silicon carbide (SiC), gallium arsenic (GaAs), gallium phosphide (GaP), indium phosphide (InP), indium arsenide (InAs), and/or indium antimonide (InSb); an alloy semiconductor such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); a non-semiconductor material, such as soda-lime glass, fused silica, fused quartz, and/or calcium fluoride (CaF2); and/or combinations thereof. In one embodiment, the substrate 202 is a silicon (Si) substrate. The substrate 202 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 102. In some such examples, a layer of the substrate 202 may include an insulator such as a semiconductor oxide, a semiconductor nitride, a semiconductor oxynitride, a semiconductor carbide, and/or other suitable insulator materials.

Doped regions, such as wells, may be formed on the substrate 202. In the embodiments represented in FIG. 2, the substrate 202 is doped with an n-type dopant in the first region 10 and is doped with a p-type dopant in the second region 20. The n-type dopant may include phosphorus (P) or arsenic (As). The p-type dopant may include boron (B), boron difluoride (BF2), or indium (In). In other words, the first region 10 is disposed on an n-type well and the second region 20 is disposed on a p-type well. The doping in the n-type well and the p-type well may be formed using ion implantation or thermal diffusion and may be considered portions of the substrate 202. As will be described further below, the first region 10 is p-type field effect transistor (PFET) region and the second region 20 is an n-type field effect transistor (NFET) region.

In the depicted embodiments, the first fin 204-1, the second fin 204-2 and, the third fin 204-3 are formed from the substrate 202 and a first semiconductor layer 208 disposed on the substrate 202. The fourth fin 204-4, the fifth fin 204-5, and the sixth fin 204-6 are formed from the substrate 202 and a second semiconductor layer 209 disposed on the substrate 202. The first semiconductor layer 208 includes a semiconductor material that has good hole mobility and the second semiconductor layer 209 includes a semiconductor material has good electron mobility. In some embodiments represented in the figures, the first semiconductor layer 208 includes silicon germanium (SiGe) and the second semiconductor layer 209 includes silicon (Si). After the deposition of the first semiconductor layer 208 over the first region 10 and the second semiconductor layer 209 over the second region 20, the workpiece 200 undergoes photolithography processes and etch processes to pattern the first fin 204-1, the second fin 204-2, the third fin 204-3, the fourth fin 204-4, the fifth fin 204-5, and the sixth fin 204-6. Each of the fins includes a base fin portion and a top fin portion. As shown in FIG. 2, each of the first fin 204-1, the second fin 204-2 and the third fin 204-3 includes a base fin 204B and a top fin portion formed of the first semiconductor layer 208. Each of the fourth fin 204-4, the fifth fin 204-5, and the sixth fin 204-6 includes a base fin 204B and a top fin portion formed from the second semiconductor layer 209. In some instances, patterning of the fins (204-1 to 204-6) may include use of double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

In the embodiments represented in FIG. 2, the second fin 204-2 and the third fin 204-3 are grouped together while the first fin 204-1 is spaced further apart from the second fin 204-2. Similarly, the fifth fin 204-5 and the sixth fin 204-6 are grouped together while the fourth fin 204-4 is spaced further apart from the fifth fin 204-5. As will be described further below, each of the first fin 204-1 and the fourth fin 204-4 will serve as a single-fin active region for a single fin device. The second fin 204-2 and the third fin 204-3 will serve as a dual-fin active region for a dual-fin device in the first region 10. The fifth fin 204-5 and the sixth fin 204-6 will serve as dual-fin device in the second region 20. In general, a single-fin device is suitable for low leakage or low current applications while a multi-fin device (e.g., a dual-fin device) is high current or high performance applications. As shown in FIG. 2, the fins for a dual-fin device may be spaced closer to one another than from a fin for a single-fin device. Due to etch loading effect, a trench between two fins of a dual-fin active region is shallower than a trench between a single fin and a dual-fin active region. In other words, the base fins B for a dual-fin active region may appear merged or connected. For example, the portion of the substrate 202 between the second fin 204-2 and the third fin 204-3 is higher than the portion of the substrate 202 between the second fin 204-2 and the first fin 204-1. Similarly, the portion of the substrate 202 between the fifth fin 204-5 and the sixth fin 204-6 is higher than the portion of the substrate 202 between the fourth fin 204-4 and the fifth fin 204-5.

Each of the first fin 204-1, the second fin 204-2 and the third fin 204-3 includes an active portion formed of the first semiconductor layer 208 and a base fin 204B formed from the substrate 202. Similarly, each of the fourth fin 204-4, the fifth fin 204-5 and the sixth fin 204-6 includes an active portion formed of the second semiconductor layer 209 and a base fin 204B formed from the substrate 202. The active portions of the fins in the first region 10 and the second region 20 have a height between about 30 nm and about 80 nm.

The first fin 204-1, the second fin 204-2, the third fin 204-3, the fourth fin 204-4, the fifth fin 204-5, and the sixth fin 204-6 are spaced apart from one another along the X direction by portions of the isolation feature 206. The isolation feature 206 may also be referred to as a shallow trench isolation (STI) feature 206. In an example process, a dielectric material for the isolation feature 206 is first deposited over the workpiece 200, filling the trenches between fins (204-1~6) with the dielectric material. In some embodiments, the dielectric material may include silicon oxide, silicon oxynitride, fluorine-doped silicate glass (FSG), a low-k dielectric, combinations thereof, and/or other suitable materials. In various examples, the dielectric material may be deposited by a CVD process, a flowable CVD (FCVD) process, spin-on coating, and/or other suitable process. The deposited dielectric material is then thinned and planarized, for example by a chemical mechanical polishing (CMP) process, until top surfaces of the fins are exposed. The planarized dielectric material is further recessed or etched back by a dry etching process, a wet etching process, and/or a combination thereof to form the isolation feature 206. In some embodiments represented in FIG. 2, at least a portion of the active portions of the first fin 204-1, the second fin 204-2, the third fin 204-3, the fourth fin 204-4, the fifth fin 204-5, and the sixth fin 204-6 rises above the isolation feature while the base fins 204B remain covered or buried in the isolation feature 206. In the embodiment depicted in FIG. 2, the active portions of the first fin 204-1, the second fin 204-2, the third fin 204-3 that rise above the isolation feature 206 are formed from the first semiconductor layer 208 and the active portions of the fourth fin 204-4, the fifth fin 204-5, the sixth fin 204-6 that rise above the isolation feature 206 are formed from the second semiconductor layer 209.

In the embodiments represented in FIG. 2, hybrid fins 210 are formed to isolate subsequently formed source/drain features. The hybrid fins 210 may be formed along with the isolation feature 206 and may include an outer layer 220 and an inner layer 222. In an example process, the dielectric material for the isolation feature 206 is first conformally deposited over the workpiece 200. Thereafter, the outer layer 220 and the inner layer 222 are sequentially deposited over the workpiece 200. After the planarization process, only the dielectric layer for the isolation feature 206 is selectively etched back to form the isolation feature 206. Because of the selective nature, the etching back also leaves behind the hybrid fins 210. Because the dielectric material for the isolation feature 206 substantially fills the space between the second fin 204-2 and the third fin 204-3 as well as between the fifth fin 204-5 and the sixth fin 204-6, hybrid fins 210 are not formed between the fins in the dual-fin active regions. The hybrid fins 210 may also be referred to as dielectric fins 210 as they are formed of dielectric materials. As shown in FIG. 2, each of the hybrid fins 210 extends into the isolation feature 206 and is spaced apart from the base fins 204B or the substrate 202 by the isolation feature 206.

Each of the first fin 204-1, the second fin 204-2, the third fin 204-3, the fourth fin 204-4, the fifth fin 204-5, and the sixth fin 204-6 includes a channel region sandwiched by two source/drain regions along the Y direction. FIG. 2 illustrates a fragmentary cross-sectional view across source/drain regions of the first fin 204-1, the second fin 204-2, the third fin 204-3, the fourth fin 204-4, the fifth fin 204-5, and the sixth fin 204-6. That means channel regions of the first fin 204-1, the second fin 204-2, the third fin 204-3, the fourth fin 204-4, the fifth fin 204-5, and the sixth fin 204-6 is out of plane in FIG. 2. In some embodiments represented in FIG. 2, the workpiece 200 also includes a first dummy gate stack 212-1 disposed over channel regions of the first fin 204-1, the second fin 204-2, and the third fin 204-3 and a second dummy gate stack 212-2 disposed over channel regions of the fourth fin 204-4, the fifth fin 204-5, and the sixth fin 204-6. Because the channel regions are out of plane in FIG. 2, the first dummy gate stack 212-1 and the second dummy gate stack 212-2 are shown in dotted lines. Each of the first dummy gate stack 212-1 and the second dummy gate stack 212-2 includes a dummy gate dielectric layer and a dummy gate electrode. The dummy gate dielectric layer is in direct contact with the first fin 204-1, the second fin 204-2, the third fin 204-3, the fourth fin 204-4, the fifth fin 204-5, and the sixth fin 204-6 as well as the hybrid fins 210. The dummy gate electrode is disposed on the dummy gate dielectric layer. In some embodiments, the dummy gate dielectric layer includes silicon oxide and the dummy gate electrode includes polysilicon.

In some implementations represented in FIG. 2, a gate spacer 218 is deposited over the workpiece 200, including the first fin 204-1, the second fin 204-2, the third fin 204-3, the fourth fin 204-4, the fifth fin 204-5, the sixth fin 204-6, and the hybrid fins 210. In the depicted embodiment, the gate spacer 218 includes a first spacer layer 214 and a second spacer layer 216. The first spacer layer 214 and the second spacer layer 216 are selected from a group consisting of silicon oxide, silicon nitride, silicon oxynitride, silicon carbonitride, silicon oxycarbonitride, and silicon carbide. A composition of the first spacer layer 214 is different from a composition of the second spacer layer 216 to introduce etching selectivity. In one embodiments, the first spacer layer 214 includes silicon oxycarbonitride or silicon carbonitride while the second spacer layer 216 include silicon oxide or silicon nitride. In some alternative embodiments, the first spacer layer 214 may include two layers with different carbon or oxygen contents.

Figure 3:
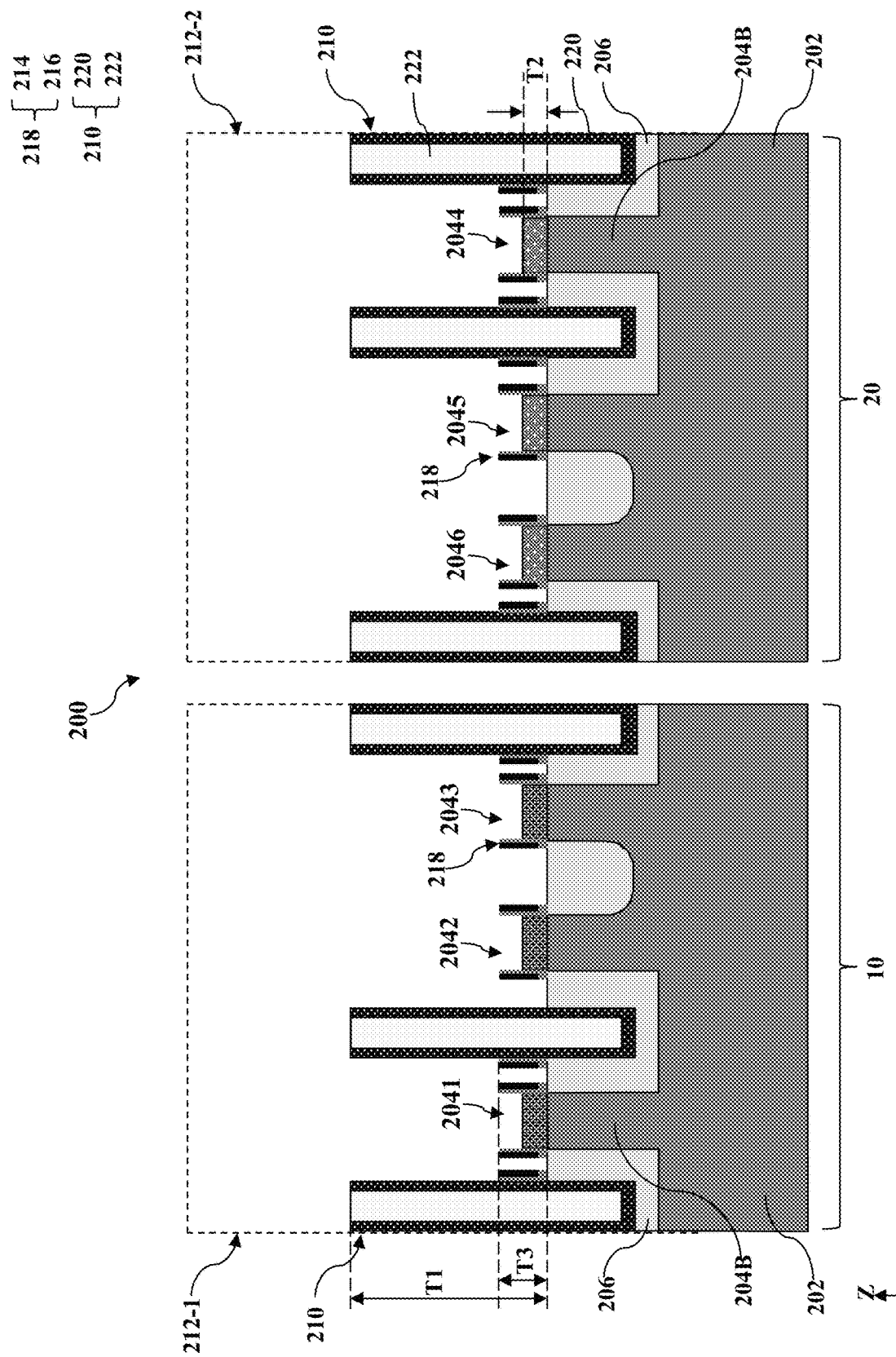

Referring to FIGS. 1 and 3, method 100 includes a block 104 where source/drain regions in the first region 10 and the second region 20 are recessed. As described above, FIGS. 2 and 3 illustrate a fragmentary cross-sectional view of source/drain regions of the first fin 204-1, the second fin 204-2, the third fin 204-3, the fourth fin 204-4, the fifth fin 204-5, the sixth fin 204-6. With the channel regions covered by the first and second dummy gate stacks 212-1 and 212-2, the workpiece 200 is subjected to an anisotropic etch process, such as a reactive-ion etching (RIE) process that includes use of a bromine-containing gas (e.g., HBr and/or $CHBr_3$), a fluorine-containing gas (e.g., $CF_4$, $SF_6$, $NF_3$, $CH_2F_2$, $CHF_3$, and/or $C_2F_6$), a carbon-containing gas (e.g., $CH_4$ or $C_2H_6$), other suitable gases, or combinations thereof. As shown in FIG. 3, the recessing at block 104 may remove the gate spacer 218 on top-facing surfaces and reduce heights of the active portions of the first fin 204-1, the second fin 204-2, the third fin 204-3, the fourth fin 204-4, the fifth fin 204-5, the sixth fin 204-6 in the source/drain regions. In the depicted embodiments, the active portions of fins in the source/drain regions are recessed to form a first semiconductor feature 2041, a second semiconductor feature 2042, a third semiconductor feature 2043, a fourth semiconductor feature 2044, a fifth semiconductor feature 2045, and a sixth semiconductor feature 2046. Each of the first semiconductor feature 2041, the second semiconductor feature 2042, the third semiconductor feature 2043, the fourth semiconductor feature 2044, the fifth semiconductor feature 2045, and the sixth semiconductor feature 2046 has a thickness between about 5 nm and about 10 nm. Each of the first semiconductor feature 2041, the second semiconductor feature 2042, the third semiconductor feature 2043, the fourth semiconductor feature 2044, the fifth semiconductor feature 2045, and the sixth semiconductor feature 2046 is disposed between two gate spacers 218 that are now disposed on the isolation feature 206. Because the etching at block 104 etches semiconductor material faster than it does the dielectric gate spacer 218, top surfaces of the first semiconductor feature 2041, the second semiconductor feature 2042, the third semiconductor feature 2043, the fourth semiconductor feature 2044, the fifth semiconductor feature 2045, and the sixth semiconductor feature 2046 are lower than top surfaces of the gate spacers 218.

Reference is still made to FIG. 3. The portion of the first fin 204-1, the second fin 204-2, the third fin 204-3, the fourth fin 204-4, the fifth fin 204-5, and the sixth fin 204-6 that rises above the isolation feature 206 has a fin height T1. The fin height T1 may be between about 30 nm and about 80 nm. This range is not trivial. When T1 is less than 30 nm, the respective fin may not contain sufficient charge carrier and the device performance may suffer. When T1 is greater than 80 nm, the risk of bent fins may outweigh the benefit of having high-aspect-ratio fins. The recessed gate spacers 218 along sidewalls of the fins may be referred to as fin sidewalls. In the depicted embodiments, each of the fin-sidewalls may have a fin sidewall height T2 measured from a top surface of the isolation feature 206. The fin sidewall height T2 is largely determined by the etch selectively between the fins and the gate spacers 218. In some embodiments, the fin sidewall height T2 is between about 5 nm and about 20 nm. In the source/drain regions, the recessed fins have recessed fin height T3. In some embodiments, the recessed fin height T3 is between about 5 nm and about 10 nm. As described above, the recessed fin height T3 is also determined by the etch selectivity between the fins and the gate spacers 218.

Figure 4:
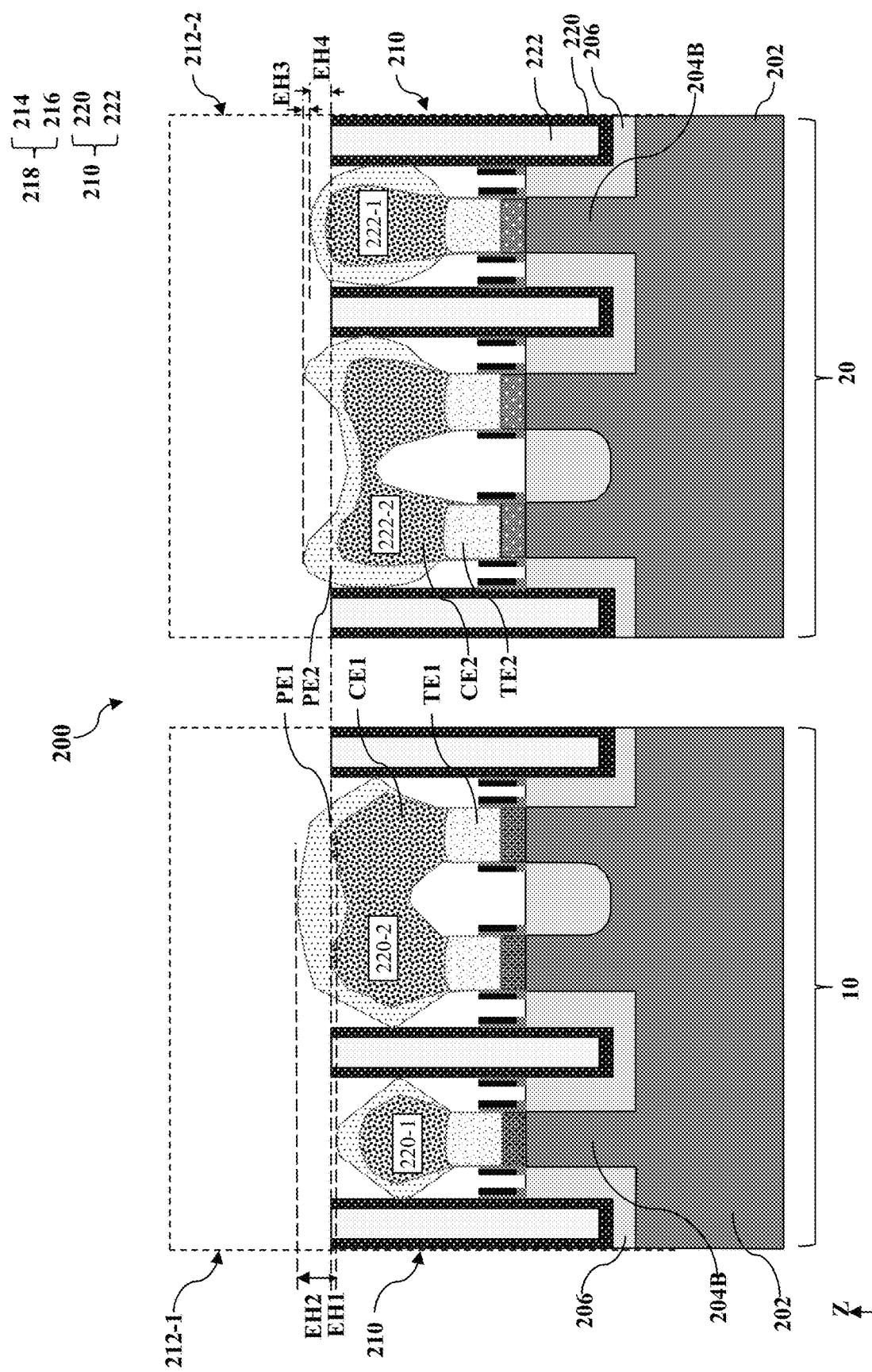

Referring to FIGS. 1 and 4, method 100 includes a block 106 where source/drain features are formed over the recessed source/drain regions in the first region 10 and the second region 20. At block 106, a first p-type source/drain feature 220-1 is formed over the first semiconductor feature 2041; a second p-type source/drain feature 220-2 is formed over the second semiconductor feature 2042 and the third semiconductor feature 2043; a first n-type source/drain feature 222-1 is formed over the fourth semiconductor feature 2044; and a second n-type source/drain feature 222-2 is formed over the fifth semiconductor feature 2045 and the sixth semiconductor feature 2046. It is noted that the second p-type source/drain feature 220-2 is a merged source/drain feature that spans over the second semiconductor feature 2042 and the third semiconductor feature 2043. The second n-type source/drain feature 222-2 is a merged source/drain feature than spans over the fifth semiconductor feature 2045 and the sixth semiconductor feature 2046. Each of the first p-type source/drain feature 220-1, the second p-type source/drain feature 220-2, the first n-type source/drain feature 222-1 and the second n-type source/drain feature 222-2 is disposed in a space defined by two adjacent hybrid fins 210. It can be seen that the hybrid fins 210 function to keep adjacent source/drain features separated from one another. The first p-type source/drain feature 220-1 and the second p-type source/drain feature 220-2 are disposed over the first region 10. The first n-type source/drain feature 222-1 and the second n-type source/drain feature 222-2 are disposed over the second region 20.

The p-type source/drain features in the first region 10 and the n-type source/drain features in the second region 20 have different compositions and are formed separately. The p-type source/drain features in the first region 10 may include silicon germanium (SiGe) or other semiconductor composition with good hole mobility and are doped with at least one p-type dopant, such as boron (B), boron difluoride ($BF_2$), or indium (In). The n-type source/drain features in the second region 20 may include silicon (Si) or other semiconductor composition with good electron mobility and are doped with at least one n-type dopant, such as phosphorus (P) or arsenic (As). In one example process, a first mask layer is first deposited to cover the second region 20 and epitaxial deposition processes are performed to form the p-type source/drain features in the first region 10. The first mask layer is then removed. A second mask layer is deposited to cover the first region 10 and epitaxial deposition processes are performed to form the n-type source/drain features in the second region 20. In another example process, a first mask layer is first deposited to cover the first region 10 and epitaxial deposition processes are performed to form the n-type source/drain features in the second region 20. The first mask layer is then removed. A second mask layer is deposited to cover the second region 20 and epitaxial deposition processes are performed to form the p-type source/drain features in the first region 10.

Each of the first p-type source/drain feature 220-1 and the second p-type source/drain feature 220-2 includes multiple epitaxial layers. In some embodiments, each of the first p-type source/drain feature 220-1 and the second p-type source/drain feature 220-2 includes a first transition epitaxial layer TE1, a first conductivity epitaxial layer CE1 disposed over the first transition epitaxial layer TE1, and a first protective epitaxial layer PE1 disposed over the first conductivity epitaxial layer CE1. The first transition epitaxial layer TE1, the first conductivity epitaxial layer CE1 and the first protective epitaxial layer PE1 are deposited using a suitable technique, such as vapor-phase epitaxy (VPE), ultra-high vacuum CVD (UHV-CVD), a cyclic deposition and etching (CDE) process, molecular beam epitaxy (MBE), and/or other suitable processes. The process temperature may be between about 600° C. and about 700° C. When the first p-type source/drain feature 220-1 and the second p-type source/drain feature 220-2 include silicon germanium (SiGe), the epitaxial deposition may include use of silane ($SiH_4$), dichlorosilane ($Si_2H_2Cl_2$), germane ($GeH_4$), and hydrogen ($H_2$). The first p-type source/drain feature 220-1 and the second p-type source/drain feature 220-2 may in-situ doped with the p-type dopant using, for example, diborane ($B_2H_6$). The first transition epitaxial layer TE1 includes less germanium (Ge) content and smaller p-type dopant than the first conductivity epitaxial layer CE1 to reduce lattice mismatch defects. In some instances, the first transition epitaxial layer TE1 includes a germanium content between 15% and about 40% and a boron concentration between about $5 \times 10^{18}$ atoms/$cm^3$ and about $5 \times 10^{20}$ atoms/$cm^3$. The first conductivity epitaxial layer CE1 includes high germanium (Ge) content and high p-type dopant concentration to reduce contact resistance and to exert stress on the channel region. In some instances, the first conductivity epitaxial layer CE1 includes a germanium content between 30% and about 60% and a boron concentration between about $1 \times 10^{20}$ atoms/$cm^3$ and about $3 \times 10^{21}$ atoms/$cm^3$. The first protective epitaxial layer PE1 is configured to be more etch resistant than the first conductive epitaxial layer CE1. In some instances, the first protective epitaxial layer PE1 includes a germanium content between 40% and about 55% and a boron concentration between about $1 \times 10^{20}$ atoms/$cm^3$ and about $1 \times 10^{21}$ atoms/$cm^3$.

Each of the first n-type source/drain feature 222-1 and the second n-type source/drain feature 222-2 includes multiple epitaxial layers. In some embodiments, each of the first n-type source/drain feature 222-1 and the second n-type source/drain feature 222-2 includes a second transition epitaxial layer TE2, a second conductivity epitaxial layer CE2 disposed over the second transition epitaxial layer TE2, and a second protective epitaxial layer PE2 disposed over the second conductivity epitaxial layer CE2. The second transition epitaxial layer TE2, the second conductivity epitaxial layer CE2 and the second protective epitaxial layer PE2 are deposited using a suitable technique, such as vapor-phase epitaxy (VPE), ultra-high vacuum CVD (UHV-CVD), a cyclic deposition and etching (CDE) process, molecular beam epitaxy (MBE), and/or other suitable processes. The process temperature may be between about 650° C. and about 750° C. When the first n-type source/drain feature 222-1 and the second n-type source/drain feature 222-2 include silicon (Si), the epitaxial deposition may include use of silane ($SiH_4$), dichlorosilane ($Si_2H_2Cl_2$), and hydrogen ($H_2$). The first n-type source/drain feature 222-1 and the second n-type source/drain feature 222-2 may in-situ doped with the n-type dopant using, for example, phosphine ($PH_3$) or arsine ($AsH_3$). The second transition epitaxial layer TE2 includes smaller n-type dopant than the second conductivity epitaxial layer CE2 to reduce lattice mismatch defects. In some instances, the second transition epitaxial layer TE2 includes a phosphorus (P) or arsenic (As) concentration between about $5 \times 10^{18}$ atoms/$cm^3$ and about $5 \times 10^{20}$ atoms/$cm^3$. The second conductivity epitaxial layer CE2 includes high n-type dopant concentration to reduce contact resistance. In some instances, the second conductivity epitaxial layer CE2 includes a phosphorus (P) concentration between about $1 \times 10^{20}$ atoms/$cm^3$ and about $4 \times 10^{21}$ atoms/$cm^3$. The second protective epitaxial layer PE2 is configured to be more etch resistant than the second conductive epitaxial layer CE2. In some instances, the second protective epitaxial layer PE2 includes a phosphorus (P) concentration between about $5 \times 10^{20}$ atoms/$cm^3$ and about $1 \times 10^{21}$ atoms/$cm^3$.

Reference is still made to FIG. 4. The first p-type source/drain feature 220-1 is lower than a top surface of the hybrid fins 210 by a first epitaxy height EH1. The second p-type source/drain feature 220-2 is higher than a top surface of the hybrid fins 210 by a second epitaxy height EH2. The second n-type source/drain feature 222-2 is higher than a top surface of the hybrid fins 210 by a third epitaxy height EH3. The first n-type source/drain feature 222-1 is higher than a top surface of hybrid fins 210 by a fourth epitaxy height EH4. In some instances, the first epitaxy height EH1 is between about 1 nm and about 3 nm, the second epitaxy height EH2 is between about 5 nm and about 10 nm, the third epitaxy height EH3 is between about 3 nm and about 8 nm, and the fourth epitaxy height EH4 is between about 1 nm and about 3 nm. It is observed that source/drain features for dual fin devices are higher than source/drain features for single fin devices. In some embodiments, the second p-type source/drain feature 220-2 is higher than the first p-type source/drain feature 220-1 by between about 7 nm and about 12 nm. The second n-type source/drain feature 222-2 is higher than the first n-type source/drain feature 222-1 by between about 1 nm and about 5 nm. The second p-type source/drain feature 220-2 is higher than the second n-type source/drain feature 220-1 by between about 1 nm and about 5 nm. The first n-type source/drain feature 222-1 is higher than the first p-type source/drain feature 220-1 by between about 1 nm and about 3 nm.

Figure 5:
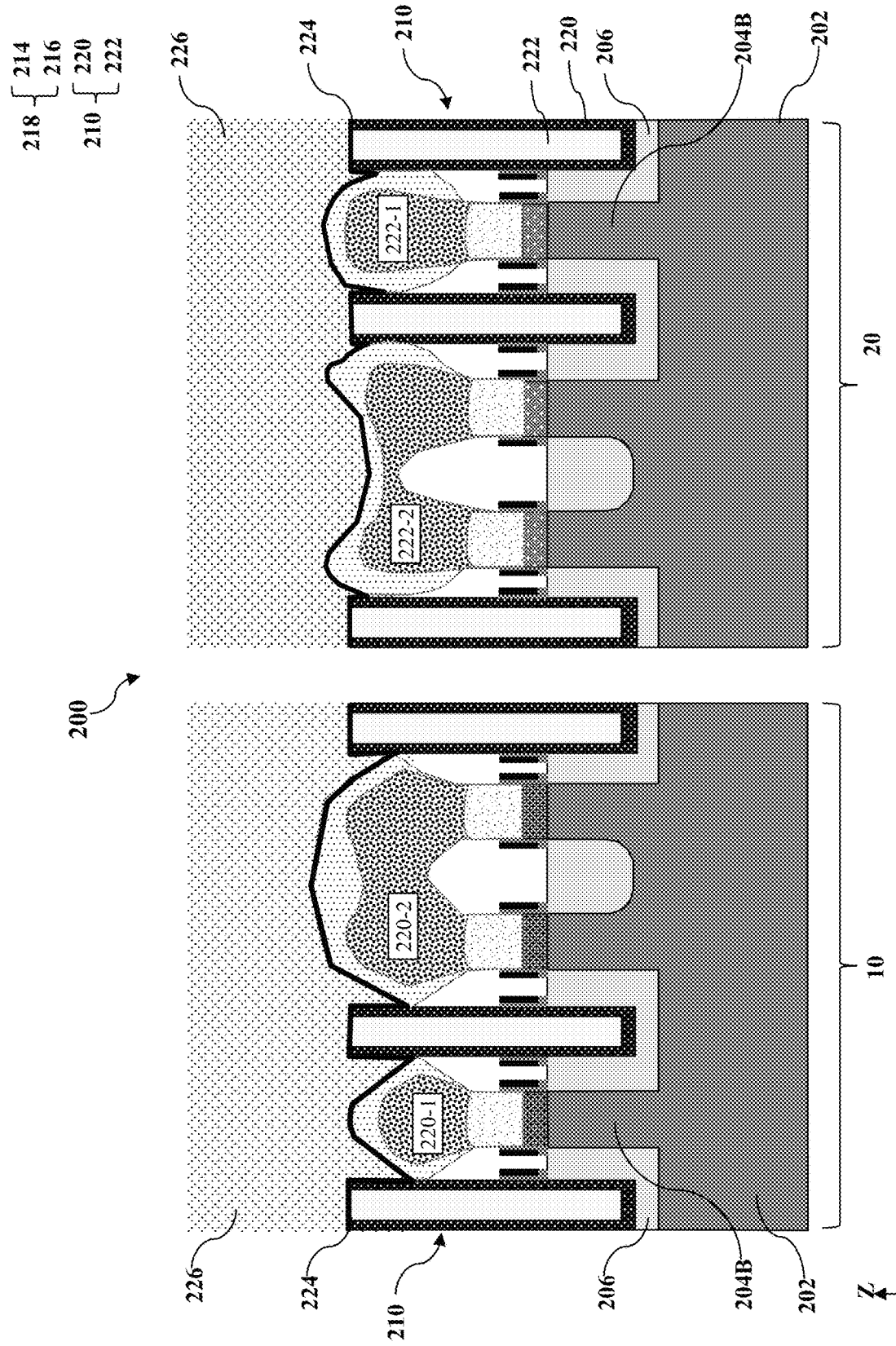

Referring to FIGS. 1 and 5, method 100 includes a block 108 where a contact etch stop layer (CESL) 224 and a first interlayer dielectric (ILD) layer 226 are deposited over the source/drain features. At block 108, the CESL 224 is conformally deposited over the first p-type source/drain feature 220-1, the second p-type source/drain feature 220-2, the first n-type source/drain feature 222-1, the second n-type source/drain feature 222-2, and the hybrid fins 210. In embodiments, the CESL 224 may be deposited using CVD or ALD and may include silicon nitride or silicon oxynitride. After the deposition of the CESL 224, the first ILD layer 226 is deposited over the CESL 224. In some implementations, the first ILD layer 226 may be deposited using CVD, FCVD, spin-on coating, or a suitable deposition method. The first ILD layer 226 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Although not explicitly illustrated in FIG. 5, a planarization process, such as a chemical mechanical polishing (CMP) process, is performed to the workpiece 200 until top surfaces of the first dummy gate stack 212-1, the second dummy gate stack 212-2, and the first ILD layer 226 are coplanar.

Additional processes may be performed to the channel regions after operations at block 108 and before the operations at block 110. For example, the first dummy gate stack 212-1 and the second dummy gate stack 212-2 are replaced with functional metal gate structures. Each of the metal gate structures includes an interfacial layer on the channel regions of the fins, a gate dielectric layer over the interfacial layer, and a gate electrode layer over the gate dielectric layer. In some embodiments, the interfacial layer includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel regions of the fins. The gate dielectric layer is then deposited over the interfacial layer using ALD, CVD, and/or other suitable methods. The gate dielectric layer may include high-K dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), $BaZrO_3$, hafnium lanthanum oxide (HfLaO), lanthanum silicon oxide (LaSiO), aluminum silicon oxide (AlSiO), hafnium tantalum oxide (HMO), hafnium titanium oxide (HMO), $(Ba,Sr)TiO_3$ (BST), silicon nitride (SiN), silicon oxynitride (SiON), combinations thereof, or other suitable material.

The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. When a self-aligned process is desired, a self-aligned cap (SAC) layer may be formed over the metal gate structures. The SAC layer may include silicon nitride.

Figure 6:
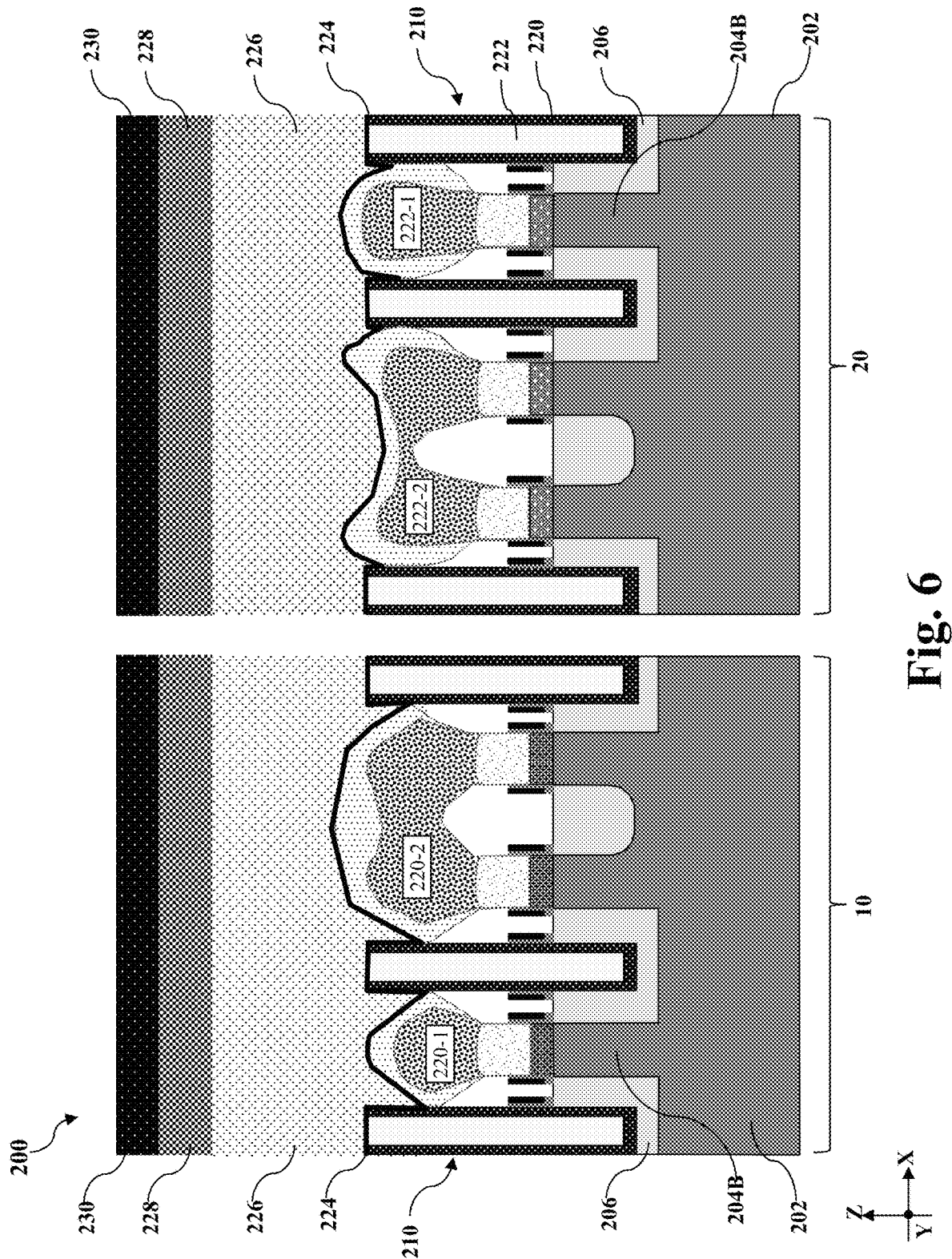

Referring to FIGS. 1 and 6, method 100 includes a block 110 where a second ILD layer 228 and a hard mask layer 230 are formed over the first ILD layer 226. The second ILD layer 228 may be similar to the first ILD layer 226 in terms of composition and formation processes. The second ILD layer 228 may be deposited using CVD, FCVD, spin-on coating, or a suitable deposition method. The second ILD layer 228 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The hard mask layer 230 is then deposited over the second ILD layer 228. The hard mask layer 230 may include tungsten carbide (WC) and may be deposited using PVD, CVD, or ALD.

Figure 7:
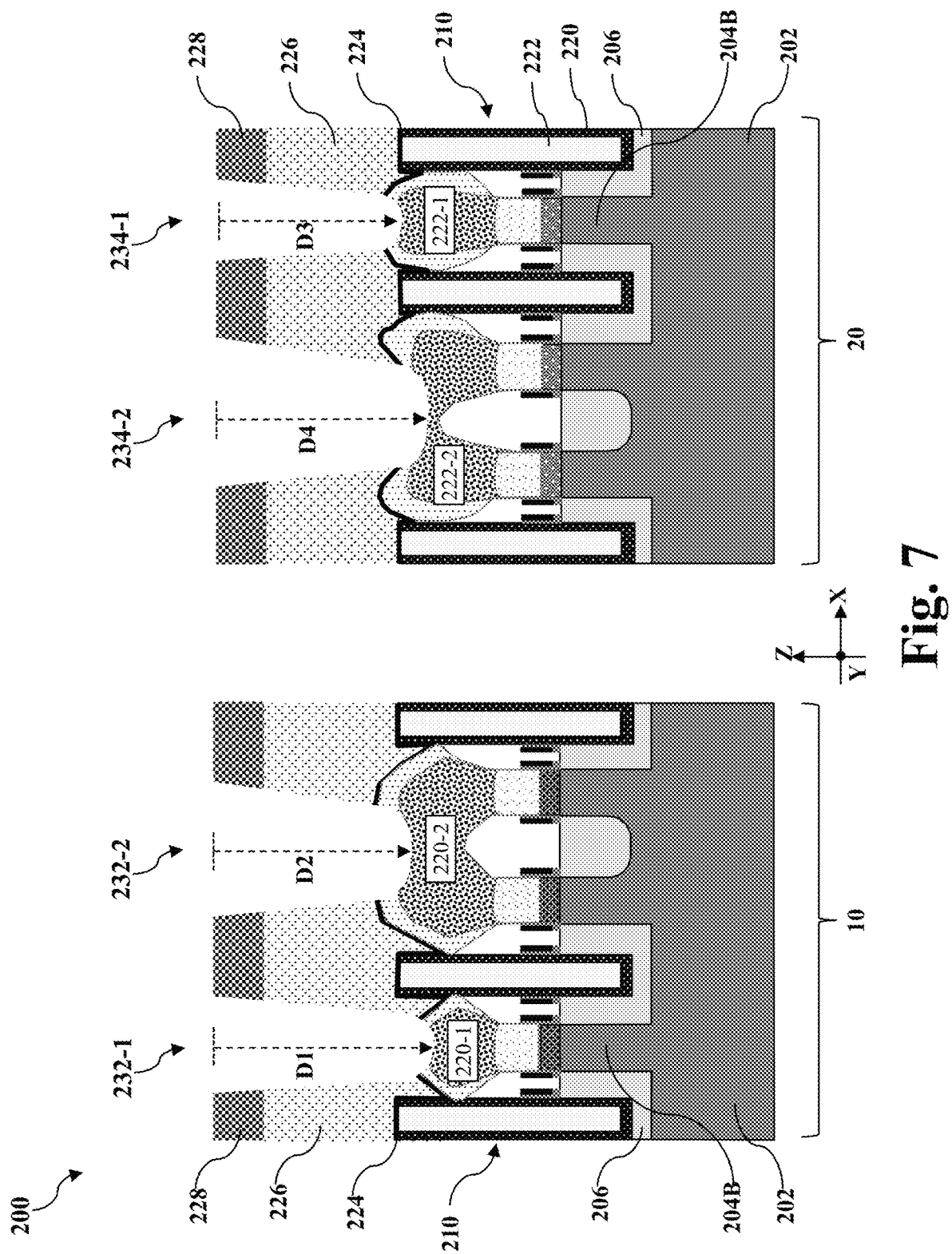

Referring to FIGS. 1 and 7, method 100 includes a block 112 where source/drain openings are formed to expose the source/drain features. The source/drain openings are formed through the second ILD layer 228, the first ILD layer 226, and the CESL 224 using a combination of photolithography processes and etch processes. In an example process, a photoresist layer is deposited over the hard mask layer 230. The photoresist layer is then exposed to a patterned radiation transmitting through or reflected from a photo mask, baked in a post-exposure bake process, developed in a developer solution, and then rinsed, thereby forming a patterned photoresist layer. The patterned photoresist layer is then applied as an etch mask to etch the hard mask layer 230 to form a patterned hard mask layer 230. The patterned hard mask layer 230 is then applied as an etch mask to etch the second ILD layer 228, the first ILD layer 226, and the CESL 224. The etch of the second ILD layer 228, the first ILD layer 226, and the CESL 224 may be a dry etch process that includes use of argon (Ar), a fluorine-containing etchant (for example, $SF_6$, $NF_3$, $CH_2F_2$, $CHF_3$, $C_4F_8$, and/or $C_2F_6$), an oxygen-containing etchant, a chlorine-containing etchant (for example, $Cl_2$, $CHCl_3$, $CCl_4$, and/or $BCl_3$), a bromine-containing etchant (for example, HBr and/or $CHBr_3$), an iodine-containing etchant, or combinations thereof. As shown in FIG. 7, the source/drain openings formed at block 112 include a first p-type contact opening 232-1, a second p-type contact opening 232-2, a first n-type contact opening 234-1, and a second n-type contact opening 234-2.

Due to different etch characteristics and the shapes of the various source/drain features, the first p-type contact opening 232-1, the second p-type contact opening 232-2, the first n-type contact opening 234-1, and the second n-type contact opening 234-2 have different shapes. In the depicted embodiments, the first p-type contact opening 232-1 has a first depth D1, the second p-type contact opening 232-2 has a second depth D2, the first n-type contact opening 234-1 has a third depth D3, and the second n-type contact opening 234-2 has a fourth depth D4. As shown in FIG. 7, the second depth D2 is greater than the first depth D1 because the second p-type source/drain feature 220-2 may have a height greater than a height of the first p-type source/drain feature 220-1. The difference between the second depth D2 and the first depth D1 may be between about 7 nm and about 12 nm. The same trend is not seen in the second region 20. As shown in FIG. 7, the fourth depth D4 is greater than the third depth D3 because the dual-fin second n-type source/drain feature 222-2 tend to have a sagging or recessed middle merge portion. The second n-type contact opening 234-2 is likely to partially extend into the recessed middle merge portion, which increases the third depth D3. The difference between the fourth depth D4 and the third depth D3 may be between about 1 nm and about 5 nm.

Figure 8:
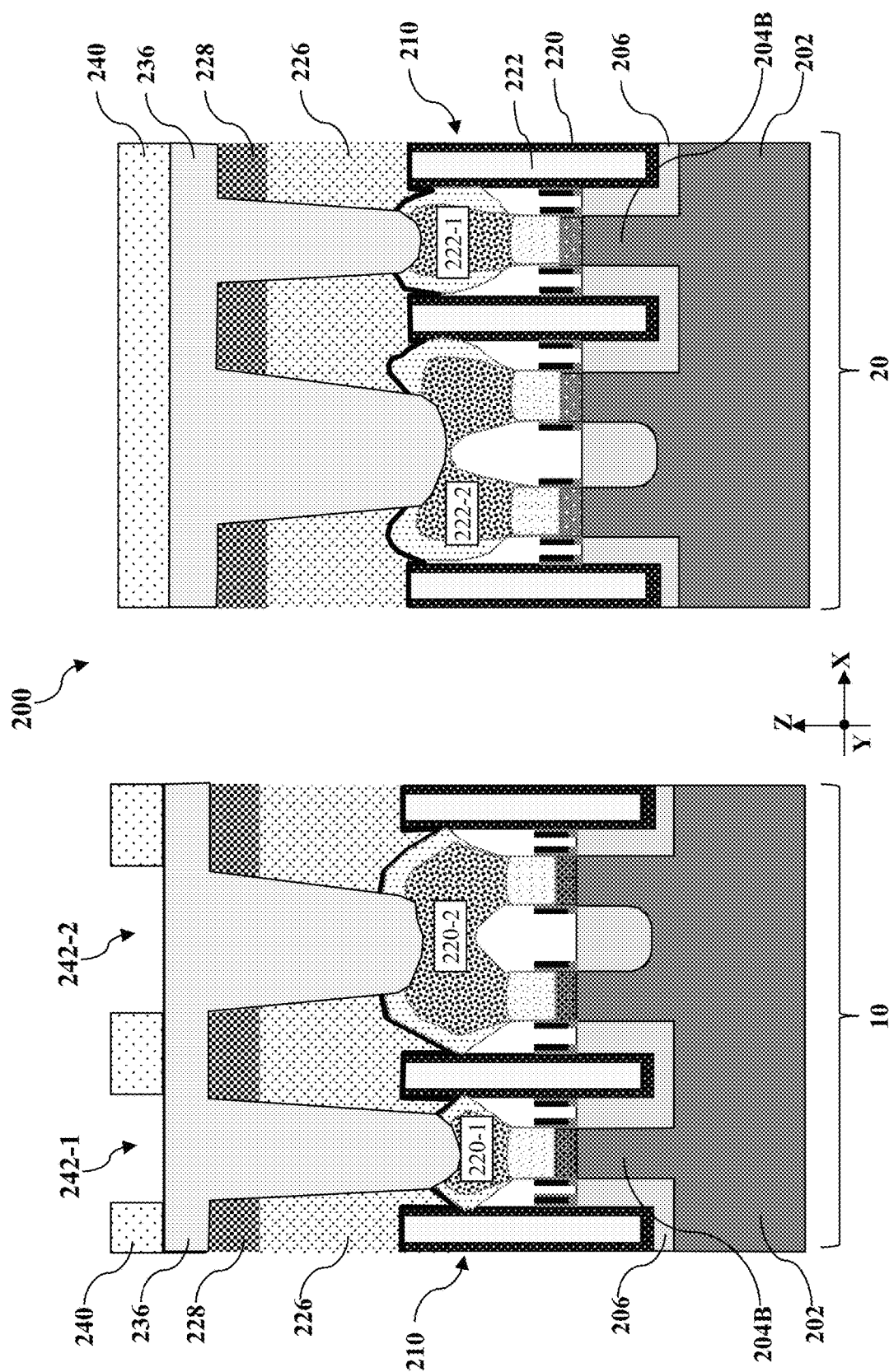

Referring to FIGS. 1 and 8, method 100 includes a block 114 where a bottom antireflective coating (BARC) layer 236 and a patterned photoresist layer 240 are formed over the workpiece 200. As shown in FIG. 8, the BARC layer 236 may be deposited over the workpiece 200 using FCVD or spin-on coating to fill in the first p-type contact opening 232-1, the second p-type contact opening 232-2, the first n-type contact opening 234-1, and the second n-type contact opening 234-2. In some instances, the BARC layer 236 may include spin-on carbon (SOC) or a silicon containing polymer, such as polysilazane resin. After the deposition of the BARC layer 236, the patterned photoresist layer 240 is formed over the BARC layer 236. The patterned photoresist layer 240 includes a first opening 242-1 and a second opening 242-2 over the first region 10 while completely covering the second region 20. The first opening 242-1 is directly over the first p-type source/drain feature 220-1. The second opening 242-2 is directly over the second p-type source/drain feature 220-2.

Figure 9:
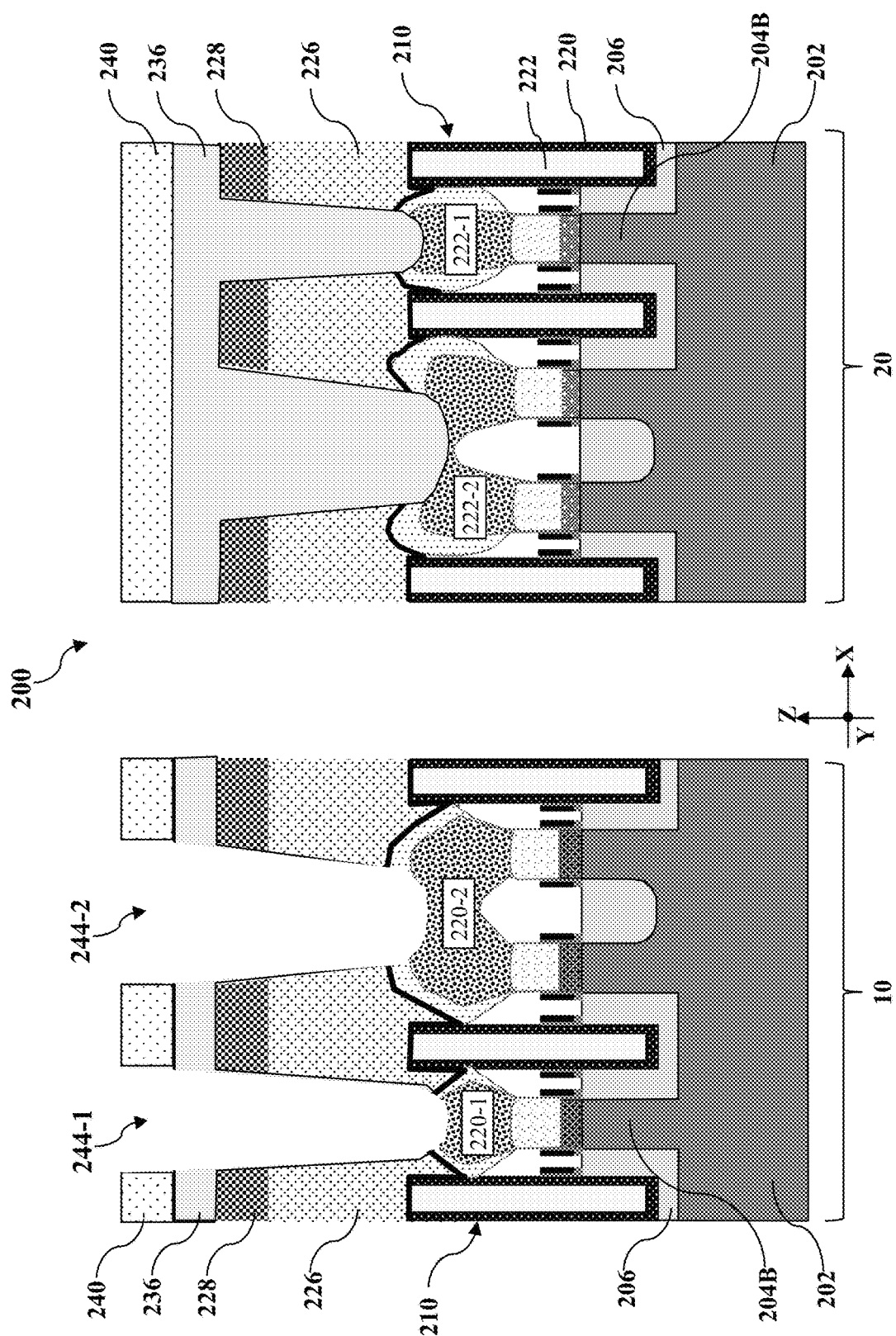

Referring to FIGS. 1 and 9, method 100 includes a block 116 where implantation openings are formed to expose the source/drain features in the first region 10. Using the patterned photoresist layer 240 as an etch mask, an etch process is performed to the workpiece 200 to form a first implantation opening 244-1 and a second implantation opening 244-2. As shown in FIG. 9, the first implantation opening 244-1 extends through the BARC layer 236, the second ILD layer 228, the first ILD layer 226, and the CESL 224 to expose the first p-type source/drain feature 220-1. The second implantation opening 244-2 extends through the BARC layer 236, the second ILD layer 228, the first ILD layer 226, and the CESL 224 to expose the second p-type source/drain feature 220-2. The etch process at block 116 may include use of plasma of hydrogen ($H_2$), nitrogen ($N_2$), or ammonia ($NH_3$). The formation of the first implantation opening 244-1 and the second implantation opening 244-2 allow selective implantation of the first p-type source/drain feature 220-1 and the second p-type source/drain feature 220-2.

Figure 10:
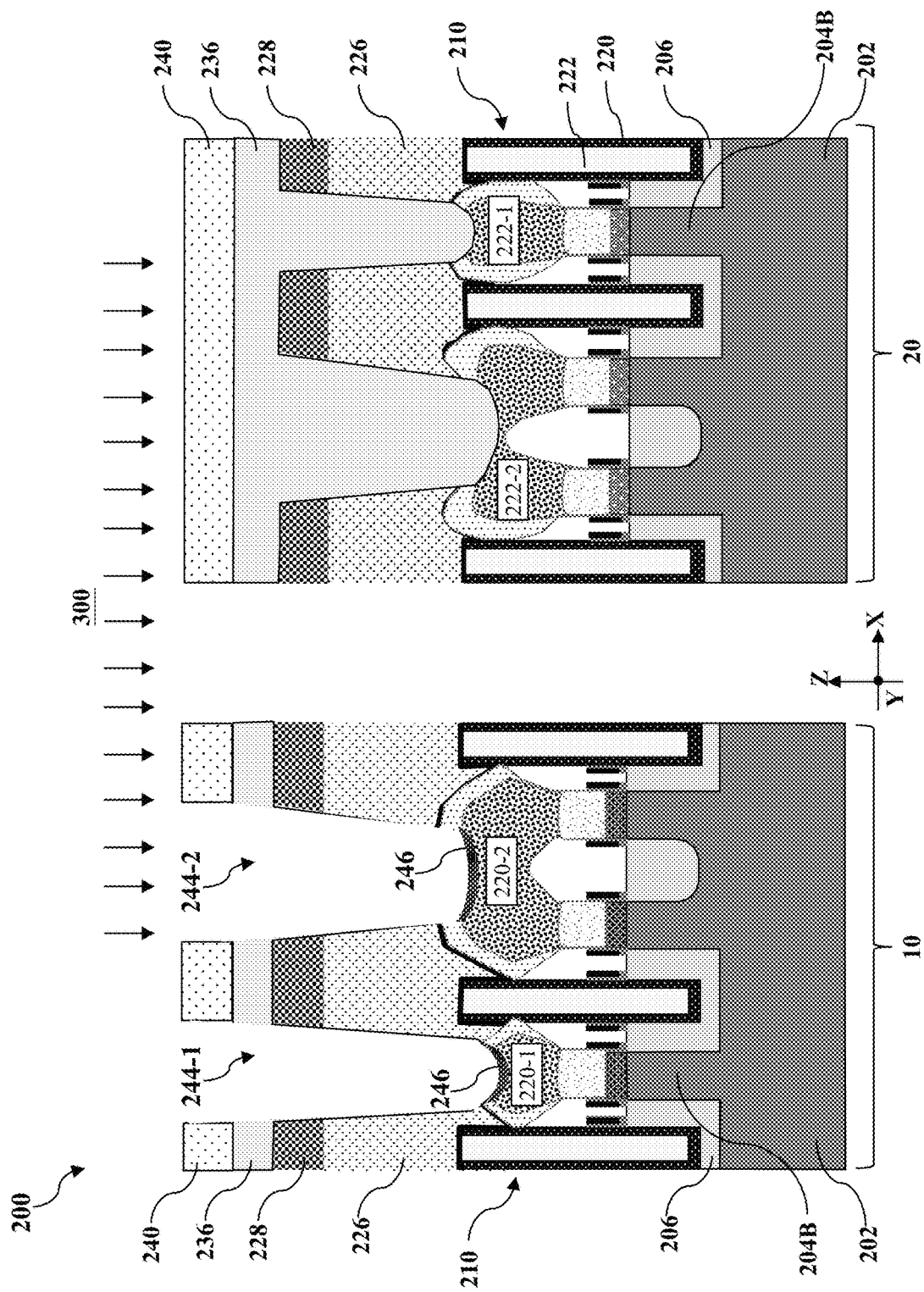

Referring to FIGS. 1 and 10, method 100 includes a block 118 where an implantation process 300 is performed. Because the formation of the first p-type contact opening 232-1 and the second p-type contact opening 232-2 may inadvertently remove too much of the first conductivity epitaxial layer CE1 in the first p-type source/drain feature 220-1 and the second p-type source/drain feature 220-2, the exposed portions of the first p-type source/drain feature 220-1 and the second p-type source/drain feature 220-2 may not have sufficiently high dopant concentration, which may lead to increased contact resistance. The implantation process 300 at block 118 operates to form a low contact resistance interface on the exposed surfaces of the first p-type source/drain feature 220-1 and the second p-type source/drain feature 220-2. The implantation process 300 may include a preamorphization implantation (PAI) process and a doping process. The PAI process creates an amorphous layer on the portions of the first p-type source/drain feature 220-1 and the second p-type source/drain feature 220-2 exposed in the first implantation opening 244-1 and the second implantation opening 244-2. In some instances, the PAI process implants germanium (Ge) at a dose between about $1\times10^{13}$ and about $1\times10^{14}/cm^2$ and at an implantation energy between about 1 KeV and about 10 KeV. The doping process then implants a p-type dopant into the amorphous layer. In the depicted embodiment, the doping process implants boron (B) at a dose between about $2\times10^{14}$ and about $5\times10^{15}/cm^2$ and at an implantation energy between about 1 KeV and about 5 KeV. The PAI may reduce the subsequent annealing temperature required to activate the p-type dopant in the first p-type source/drain feature 220-1 and the second p-type source/drain feature 220-2. After the doping process, the workpiece 200 is anneal at a temperature between about 400° C. and about 600° C. The anneal may be a flash anneal. The implantation process 300 and the anneal form a contact layer 246 on the first p-type source/drain feature 220-1 and the second p-type source/drain feature 220-2. After the anneal, the patterned photoresist layer 240 and the BARC layer 236 are removed by ashing or selective etching.

Figure 11:
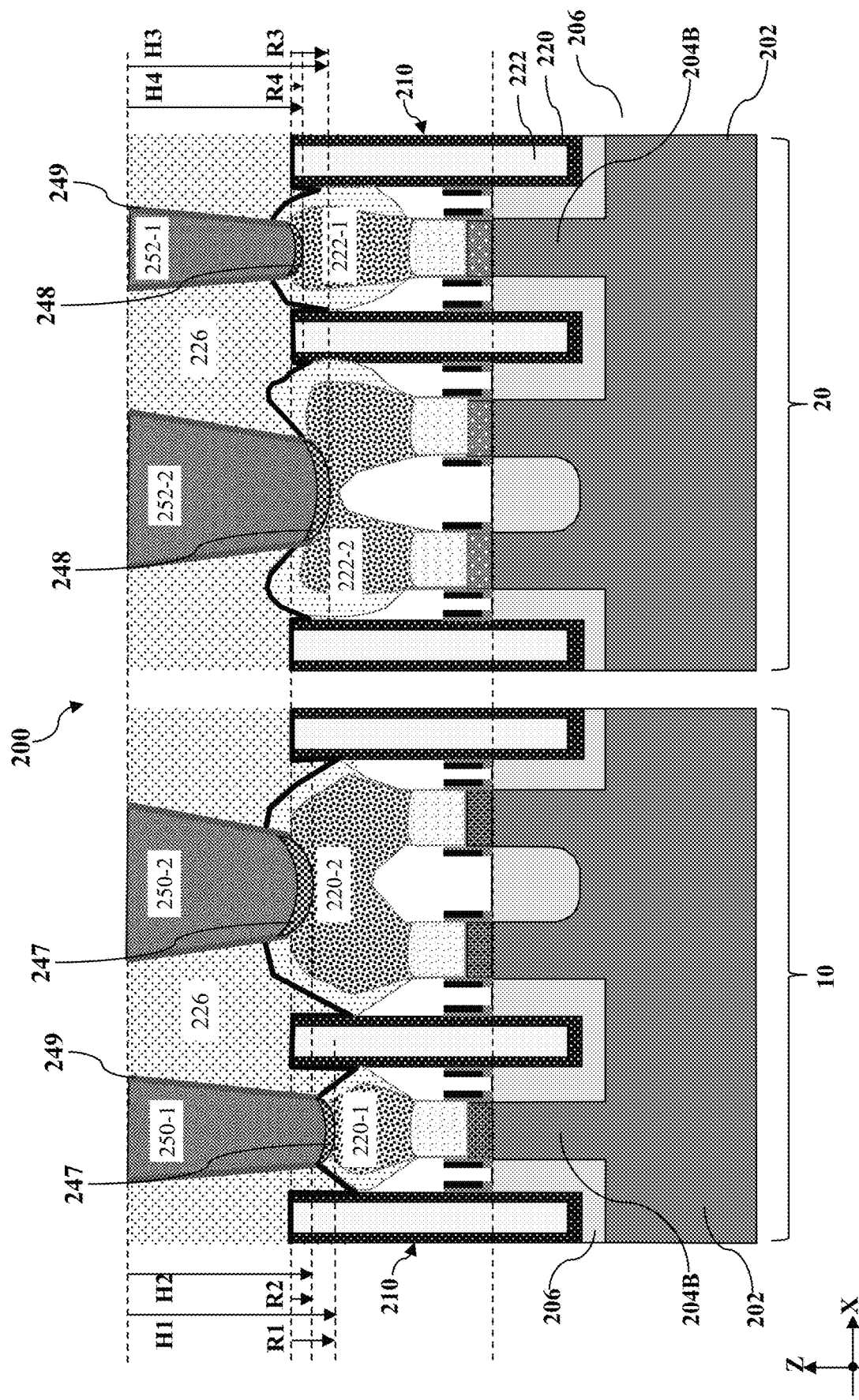

Referring to FIGS. 1 and 11, method 100 includes a block 120 where source/drain contacts are formed to couple to the source/drain features. Operations at block 120 may include a wet cleaning process, formation of silicide layers, formation of a barrier layer, and deposition of a metal fill layer. To remove debris or residual photoresist layer, a wet clean process may be performed. The wet clean process may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and or hydrofluoric acid for oxide removal. To reduce contact resistance, first silicide layers 247 are formed on the first p-type source/drain feature 220-1 and the second p-type source/drain feature 220-2 and second silicide layers 248 are formed on the first n-type source/drain feature 222-1 and the second n-type source/drain feature 222-2. To form the first silicide layers 247 and the second silicide layers 248, a metal precursor, such as titanium (Ti), is deposited over the contact layers 246 in the first region 10 and the exposed surfaces of the first n-type source/drain feature 222-1 and the second n-type source/drain feature 222-2 in the second region 20. An anneal process is then performed to bring about silicidation (and germinidation in the first region 10) between the metal precursor and the exposed semiconductor surfaces. In the depicted embodiments, titanium may react with silicon germanium in the contact layers 246 to form the first silicide layer 247 and may react with silicon in the first n-type source/drain feature 222-1 and the second n-type source/drain feature 222-2 to form the second silicide layers 248. In some embodiments, the metal precursor deposited on sidewalls of the source/drain contact opening (filled with a first p-type contact 250-1, a second p-type contact 250-2, a first n-type contact 252-1, and a second n-type contact 252-2 in FIG. 11) may be nitridated with nitrogen or ammonia to form a barrier layer 249. In some alternative embodiments, the unreacted metal precursor is selectively removed and the barrier layer 249 is formed anew. The barrier layer 249 may include titanium nitride (TiN), tantalum nitride (TaN), cobalt nitride (CoN), nickel nitride (NiN), manganese nitride (MnN), tungsten nitride (WN), or other transition metal nitride. In one embodiment, the barrier layer 249 includes titanium nitride (TiN).

After the formation of the silicide layers (e.g., 247 and 248) and the barrier layer 249, the metal fill layer is deposited over them to form the first p-type contact 250-1, the second p-type contact 250-2, the first n-type contact 252-1, and the second n-type contact 252-2. In some embodiments, the metal fill layer may include cobalt (Co), ruthenium (Ru), nickel (Ni), or tungsten (W). In one embodiment, the metal fill layer includes cobalt (Co). After the deposition of the metal fill layer, a planarization process, such as a CMP process, is performed to remove excess materials. At this point, top surfaces of the first p-type contact 250-1, the second p-type contact 250-2, the first n-type contact 252-1, and the second n-type contact 252-2 are coplanar.

Reference is still made to FIG. 11. The first p-type contact 250-1 has a first height H1 (including the first silicide layer 247), the second p-type contact 250-2 has a second height H2 (including the first silicide layer 247), the first n-type contact 252-1 has a third height H3 (including the second silicide layer 248), and the second n-type contact 252-2 has a fourth height H4 (including the second silicide layer 248). The first height H1, the second height H2, the third height H3, and the fourth height H4 follow the trend observed among the first depth D1, the second depth D2, the third depth D3, and the fourth depth D4 described above. The first height H1 is greater than the second height H2 by a margin between about 5 nm and about 10 nm. The fourth height H4 is greater than the third height H3 by a margin between about 1 nm and about 5 nm.

As measured from the top surface level of the hybrid fins 210 downward, the first p-type contact 250-1 has a first reach depth R1, the second p-type contact 250-2 has a second reach depth R1, the first n-type contact 252-1 has a third reach depth R3, and the second n-type contact 252-2 has a fourth reach depth R4. In some embodiments, the first reach depth R1 may be between about 15 nm and about 20 nm, the second reach depth R2 may be between about 10 nm and about 15 nm, the third reach depth R3 may be between about 1 nm and about 5 nm, and the fourth reach depth R4 may be between about 5 nm and about 10 nm. These reach depth ranges are not trivial. When the first reach depth R1 is less than 15 nm, the second reach depth R2 is less than 10 nm, the third reach depth R3 is less than 1 nm, and the fourth reach depth R4 is less than 5 nm, the corresponding contact cannot land on the most heavily doped first conductive epitaxial layers CE1 in the first region 10 or second conductive epitaxial layers in the second region 20. When the first reach depth R1 is more than 20 nm, the second reach depth R2 is more than 15 nm, the third reach depth R3 is more than about 5 nm, and the fourth reach depth R4 is more than 10 nm, the corresponding contact may penetrate the most heavily doped first conductive epitaxial layers CE1 in the first region 10 or second conductive epitaxial layers in the second region 20, resulting in dopant loss. Additionally, When the first reach depth R1 is more than 20 nm, the second reach depth R2 is more than 15 nm, the third reach depth R3 is more than about 5 nm, and the fourth reach depth R4 is more than 10 nm, the corresponding contact may overlap with the channel region, causing short channel effect in the respective device.

The present disclosure provides for many different embodiments. In one embodiment, a semiconductor structure is provided. The semiconductor structure includes a first p-type epitaxial feature disposed over a first fin, a second p-type epitaxial feature disposed and spanning over a second fin and a third fin, an interlayer dielectric (ILD) layer over the first p-type epitaxial feature and the second p-type epitaxial feature, a first contact extending through the ILD layer to electrically couple to the first p-type epitaxial feature, and a second contact extending through the ILD layer to electrically coupled to the second p-type epitaxial feature. A bottom surface of the first contact is lower than a bottom surface of the second contact.

In some embodiments, a first n-type epitaxial feature disposed over a fourth fin, a second n-type epitaxial feature disposed and spanning over a fifth fin and a sixth fin, the ILD layer over the first n-type epitaxial feature and the second n-type epitaxial feature, a third contact extending through the ILD layer to electrically couple to the first n-type epitaxial feature, and a fourth contact extending through the ILD layer to electrically coupled to the second n-type epitaxial feature. A bottom surface of the fourth contact is lower than a bottom surface of the third contact. In some embodiments, the second p-type epitaxial feature includes a first p-type epitaxial layer and a second p-type epitaxial layer over the first p-type epitaxial layer. The first p-type epitaxial layer and the second p-type epitaxial layer includes a p-type dopant and a concentration of the p-type dopant in the second p-type epitaxial layer is greater than a concentration of the p-type dopant in the first p-type epitaxial layer. In some implementations, the second contact lands in the second p-type epitaxial layer. In some instances, the second n-type epitaxial feature includes a first n-type epitaxial layer and a second n-type epitaxial layer over the first n-type epitaxial layer. The first n-type epitaxial layer and the second n-type epitaxial layer includes an n-type dopant. A concentration of the n-type dopant in the second n-type epitaxial layer is greater than a concentration of the n-type dopant in the first n-type epitaxial layer. In some embodiments, the fourth contact lands in the second n-type epitaxial layer. In some embodiments, top surfaces of the first contact, the second contact, the third contact, and the fourth contact are coplanar and a height of the first contact is greater than a height of the second contact. In some implementations, a height of the fourth contact is greater than a height of the third contact.

In another embodiment, a semiconductor structure is provided. The semiconductor structure includes a first base fin, a second base fin, and a third base fin over a substrate, a first semiconductor layer over the first base fin, a second semiconductor layer over the second base fin, a third semiconductor layer over the third base fin, a first p-type source/drain feature over the first semiconductor layer, a second p-type source/drain feature disposed and spanning over a second semiconductor layer and a third semiconductor layer, an interlayer dielectric (ILD) layer over the first p-type source/drain feature and the second p-type source/drain feature, a first contact extending through the ILD layer to electrically couple to the first p-type source/drain feature, and a second contact extending through the ILD layer to electrically coupled to the second p-type source/drain feature. A bottom surface of the first contact is lower than a bottom surface of the second contact.

In some embodiments, the first base fin, the second base fin, and the third base fin include silicon and an n-type dopant. In some embodiments, the first semiconductor layer, the second semiconductor layer, and the third semiconductor layer include silicon germanium (SiGe). In some implementations, the semiconductor structure further includes an isolation feature. The first base fin, the second base fin, and the third base fin are disposed in the isolation feature. In some embodiments, the semiconductor structure may further include at least one gate spacer features disposed along sidewalls of the first semiconductor layer, the second semiconductor layer, and the third semiconductor layer. The at least one gate spacer feature is disposed over a top surface of the isolation feature. In some embodiments, the semiconductor structure further includes a dielectric fin disposed between the first p-type source/drain feature and the second p-type source/drain feature. The dielectric fin extends into the isolation feature.

In yet another embodiment, a semiconductor structure is provided. The semiconductor structure includes a first base fin, a second base fin, and a third base fin over a substrate, a first semiconductor layer over the first base fin, a second semiconductor layer over the second base fin, a third semiconductor layer over the third base fin, a first n-type source/drain feature over the first semiconductor layer, a second n-type source/drain feature disposed and spanning over a second semiconductor layer and a third semiconductor layer, an interlayer dielectric (ILD) layer over the first n-type source/drain feature and the second n-type source/drain feature, a first contact extending through the ILD layer to electrically couple to the first n-type source/drain feature, and a second contact extending through the ILD layer to electrically coupled to the second n-type source/drain feature. A bottom surface of the second contact is lower than a bottom surface of the first contact.

In some embodiments, the first base fin, the second base fin, and the third base fin include silicon and a p-type dopant. In some embodiments, the first semiconductor layer, the second semiconductor layer, and the third semiconductor layer include silicon (Si). In some implementations, the semiconductor structure further includes an isolation feature. The first base fin, the second base fin, and the third base fin are disposed in the isolation feature. In some instances, the semiconductor structure further includes at least one gate spacer features disposed along sidewalls of the first semiconductor layer, the second semiconductor layer, and the third semiconductor layer. The at least one gate spacer feature is disposed over a top surface of the isolation feature. In some embodiments, the semiconductor structure further includes a dielectric fin disposed between the first n-type source/drain feature and the second n-type source/drain feature. The dielectric fin extends into the isolation feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
a first p-type epitaxial feature disposed over a first fin;
a second p-type epitaxial feature disposed and spanning over a second fin and a third fin;
an interlayer dielectric (ILD) layer over the first p-type epitaxial feature and the second p-type epitaxial feature;
a dielectric fin extending from between the first fin and the second fin to between the first p-type epitaxial feature and the second p-type epitaxial feature;
a first contact extending through the ILD layer to electrically couple to the first p-type epitaxial feature; and
a second contact extending through the ILD layer to electrically coupled to the second p-type epitaxial feature,
wherein a bottom surface of the first contact is lower than a bottom surface of the second contact,
wherein a top surface of the dielectric fin is higher than a top surface of the first p-type epitaxial feature and a top surface of the second p-type epitaxial feature is higher than the top surface of the dielectric fin.

2. The semiconductor structure of claim 1, further comprising:
a first n-type epitaxial feature disposed over a fourth fin;
a second n-type epitaxial feature disposed and spanning over a fifth fin and a sixth fin;
the ILD layer over the first n-type epitaxial feature and the second n-type epitaxial feature;
a third contact extending through the ILD layer to electrically couple to the first n-type epitaxial feature; and
a fourth contact extending through the ILD layer to electrically coupled to the second n-type epitaxial feature,
wherein a bottom surface of the fourth contact is lower than a bottom surface of the third contact.

3. The semiconductor structure of claim 1,
wherein the second p-type epitaxial feature comprises a first p-type epitaxial layer and a second p-type epitaxial layer over the first p-type epitaxial layer,
wherein the first p-type epitaxial layer and the second p-type epitaxial layer comprises a p-type dopant,
wherein a concentration of the p-type dopant in the second p-type epitaxial layer is greater than a concentration of the p-type dopant in the first p-type epitaxial layer.

4. The semiconductor structure of claim 3, wherein the second contact lands in the second p-type epitaxial layer.

5. The semiconductor structure of claim 2,
wherein the second n-type epitaxial feature comprises a first n-type epitaxial layer and a second n-type epitaxial layer over the first n-type epitaxial layer,
wherein the first n-type epitaxial layer and the second n-type epitaxial layer comprises an n-type dopant,
wherein a concentration of the n-type dopant in the second n-type epitaxial layer is greater than a concentration of the n-type dopant in the first n-type epitaxial layer.

6. The semiconductor structure of claim 5, wherein the fourth contact lands in the second n-type epitaxial layer.

7. The semiconductor structure of claim 2,
wherein top surfaces of the first contact, the second contact, the third contact, and the fourth contact are coplanar,
wherein a height of the first contact is greater than a height of the second contact.

8. The semiconductor structure of claim 7, wherein a height of the fourth contact is greater than a height of the third contact.

9. A semiconductor structure, comprising:
a first base fin, a second base fin, and a third base fin over a substrate;
a first semiconductor layer over the first base fin;
a second semiconductor layer over the second base fin;
a third semiconductor layer over the third base fin;
a first p-type source/drain feature over the first semiconductor layer;
a second p-type source/drain feature disposed and spanning over the second semiconductor layer and the third semiconductor layer;
an interlayer dielectric (ILD) layer over the first p-type source/drain feature and the second p-type source/drain feature;
a first contact extending through the ILD layer to electrically couple to the first p-type source/drain feature; and
a second contact extending through the ILD layer to electrically coupled to the second p-type source/drain feature,
wherein a bottom surface of the first contact is lower than a bottom surface of the second contact,
wherein a first portion of the substrate between the first base fin and the second base fin is higher than a second portion of the substrate between the second base fin and the third base fin.

10. The semiconductor structure of claim 9, wherein the first base fin, the second base fin, and the third base fin comprise silicon and an n-type dopant.

11. The semiconductor structure of claim 9, wherein the first semiconductor layer, the second semiconductor layer, and the third semiconductor layer comprise silicon germanium (SiGe).

12. The semiconductor structure of claim 9, further comprising:
an isolation feature,
wherein the first base fin, the second base fin, and the third base fin are disposed in the isolation feature.

13. The semiconductor structure of claim 12, further comprising:
at least one gate spacer feature disposed along sidewalls of the first semiconductor layer, the second semiconductor layer, and the third semiconductor layer,
wherein the at least one gate spacer feature is disposed over a top surface of the isolation feature.

14. The semiconductor structure of claim 12, further comprising:
a dielectric fin disposed between the first p-type source/drain feature and the second p-type source/drain feature,
wherein the dielectric fin extends into the isolation feature.

15. A semiconductor structure, comprising:
a first base fin, a second base fin, and a third base fin over a substrate;
a first semiconductor layer over the first base fin;
a second semiconductor layer over the second base fin;
a third semiconductor layer over the third base fin;
a first n-type source/drain feature over the first semiconductor layer;
a second n-type source/drain feature disposed and spanning over the second semiconductor layer and the third semiconductor layer;
an interlayer dielectric (ILD) layer over the first n-type source/drain feature and the second n-type source/drain feature;
a first contact extending through the ILD layer to electrically couple to the first n-type source/drain feature; and
a second contact extending through the ILD layer to electrically coupled to the second n-type source/drain feature,
wherein a bottom surface of the second contact is lower than a bottom surface of the first contact,
wherein a first portion of the substrate between the first base fin and the second base fin is higher than a second portion of the substrate between the second base fin and the third base fin.

16. The semiconductor structure of claim 15, wherein the first base fin, the second base fin, and the third base fin comprise silicon and a p-type dopant.

17. The semiconductor structure of claim 15, wherein the first semiconductor layer, the second semiconductor layer, and the third semiconductor layer comprise silicon (Si).

18. The semiconductor structure of claim 15, further comprising:
an isolation feature,
wherein the first base fin, the second base fin, and the third base fin are disposed in the isolation feature.

19. The semiconductor structure of claim 18, further comprising:
at least one gate spacer features disposed along sidewalls of the first semiconductor layer, the second semiconductor layer, and the third semiconductor layer,
wherein the at least one gate spacer feature is disposed over a top surface of the isolation feature.

20. The semiconductor structure of claim 18, further comprising:
a dielectric fin disposed between the first n-type source/drain feature and the second n-type source/drain feature,
wherein the dielectric fin extends into the isolation feature,
wherein the dielectric fin interfaces the first n-type source/drain feature and the second n-type source/drain feature.

* * * * *